(12) United States Patent
Downs

(10) Patent No.: US 7,419,607 B2
(45) Date of Patent: Sep. 2, 2008

(54) ANTI-BIOFILM FORMING STRUCTURE AND METHOD OF MANUFACTURING THE SAME

(76) Inventor: Bradley Downs, 200 S. Wilcox #417, Castle Rock, CO (US) 80104

( * ) Notice: Subject to any disclaimer, the term of this patent is extended or adjusted under 35 U.S.C. 154(b) by 407 days.

(21) Appl. No.: 10/543,648

(22) PCT Filed: Apr. 6, 2004

(86) PCT No.: PCT/US2004/010794
§ 371 (c)(1),
(2), (4) Date: Dec. 19, 2005

(87) PCT Pub. No.: WO2004/092075
PCT Pub. Date: Oct. 28, 2004

(65) Prior Publication Data
US 2006/0180552 A1    Aug. 17, 2006

Related U.S. Application Data

(60) Provisional application No. 60/460,927, filed on Apr. 7, 2003.

(51) Int. Cl.
C02F 1/00    (2006.01)
C02F 1/50    (2006.01)
C02F 1/68    (2006.01)
B29D 22/00   (2006.01)
B29D 23/00   (2006.01)

(52) U.S. Cl. .............. 210/764; 210/192; 210/198.1; 210/205; 210/251; 210/916; 264/5; 264/131; 264/141; 264/311; 264/DIG. 25; 428/36.4; 428/40.2; 428/542.8

(58) Field of Classification Search .............. 210/749, 210/764, 198.1, 251, 916, 192, 205, 206; 264/5, 129, 131, 140, 141, 176.1, 299, 311, 264/DIG. 25, 310; 428/35.7, 36.4, 402, 542.8
See application file for complete search history.

(56) References Cited

U.S. PATENT DOCUMENTS

| 4,342,716 | A |   | 8/1982 | Fishbaugh et al. |
|---|---|---|---|---|
| 4,775,585 | A | * | 10/1988 | Hagiwara et al. .... 264/DIG. 25 |
| 5,554,373 | A |   | 9/1996 | Seabrook et al. |
| 5,595,750 | A |   | 1/1997 | Jacobson et al. |
| 5,683,632 | A |   | 11/1997 | Shimizu et al. |

(Continued)

*Primary Examiner*—Jason M Greene
(74) *Attorney, Agent, or Firm*—Townsend and Townsend and Crew LLP

(57) ABSTRACT

A biofilm resistant fluid handling system is provided having at least one structural component adapted to retain or deliver fluid. The at least one structural component is formed from a biofilm resistant material comprising polymeric resin and an inorganic carrier conjugated with a biocidal metal ion. When a surface of the at least one structural component is exposed to a continuous or intermittent aqueous solution environment the formation of active biofilm on the surface is prevented and planktonic bacteria in proximity of said surface is killed. Additionally, methods for extending the biocidal properties of a biofilm resistant fluid handling system are provided. One includes continuously or periodically introducing a biocidal metal ion into contents of the aqueous solution environment resulting in equilibrium of biocidal metal ion exchange between the biofilm resistant material of the handling system and the aqueous solution environment, Another includes affixing a solvent, comprising an inorganic carrier conjugated with a biocidal metal ion, to the surface of the fluid handling system.

16 Claims, 1 Drawing Sheet

U.S. PATENT DOCUMENTS

| | | |
|---|---|---|
| 5,817,325 A | 10/1998 | Sawan et al. |
| 6,101,833 A * | 8/2000 | Suzuki .......................... 62/340 |
| 6,630,106 B1 | 10/2003 | Levy |
| 7,261,285 B2 * | 8/2007 | Kienbock et al. ........ 261/112.1 |
| 2002/0162800 A1 | 11/2002 | Back et al. |
| 2007/0138071 A1 * | 6/2007 | Froggatt ..................... 210/153 |

* cited by examiner

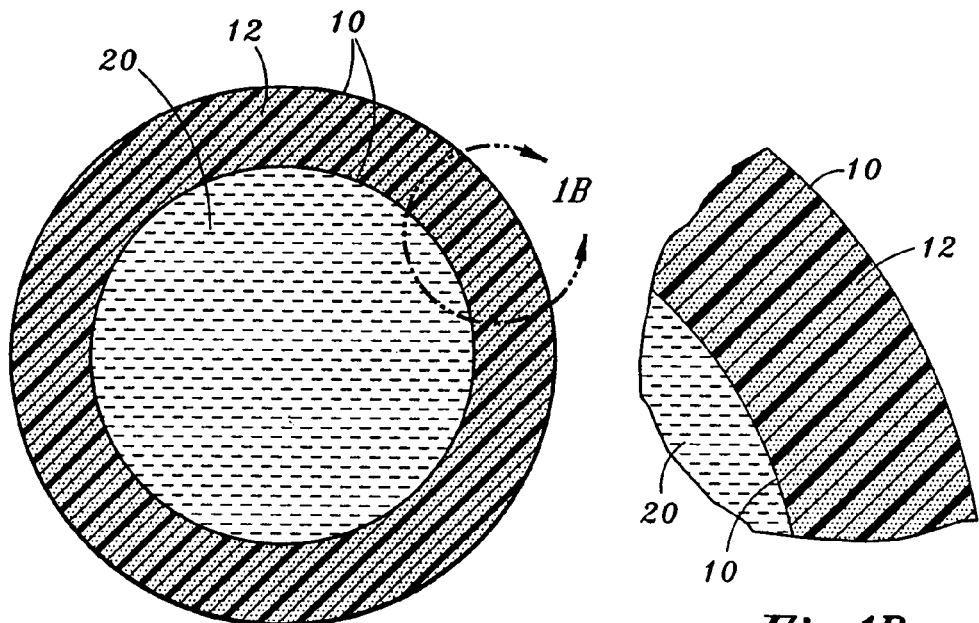
Fig. 1A
Fig. 1B
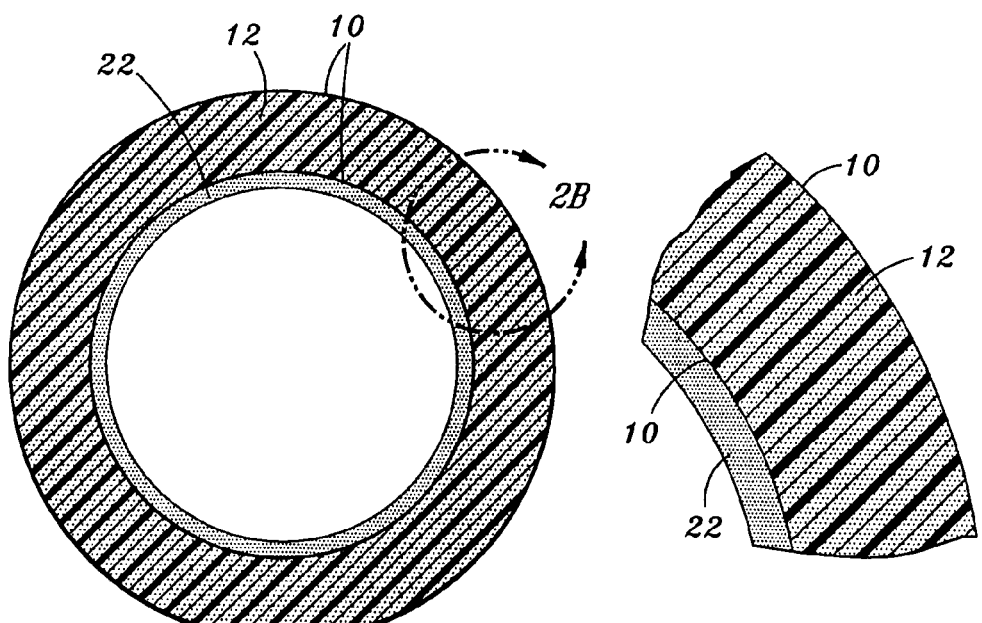
Fig. 2A
Fig. 2B

ANTI-BIOFILM FORMING STRUCTURE AND METHOD OF MANUFACTURING THE SAME

CROSS-REFERENCE TO RELATED APPLICATIONS

This application claims the benefit of U.S. Provisional Application No. 60/460,927 filed on Apr. 7, 2003. Additionally, this application is related to PCT International Application No. PCT/US02/10960 filed on Apr. 9, 2002, entitled "Structure and Process for Continuously Treating Dental Unit Water", which is based upon U.S. Provisional 60/282,376, filed Apr. 9, 2001, entitled "Structure and Process for Continuously Treating Dental Unit Water", the contents of which are incorporated herein by reference.

STATEMENT RE: FEDERALLY SPONSORED RESEARCH/DEVELOPMENT

Not Applicable

BACKGROUND OF THE INVENTION

1. Field of the Invention

The invention relates to polymeric resin based enclosed water systems comprising biocidal metal-ions preventing the formation of biofilm. The enclosed water systems commonly include reservoirs and/or delivery tubing having intermittent or continuous flow. Such water systems are most commonly used in the dental and medical fields.

2. Background of the Invention

The formation of sessile bacteria on water-bearing surfaces results in communities of live biofilms. Biofilms are implicated in a significant amount of human bacterial infections. Bacterial biofilms also cause fouling, product contamination, equipment failure, and decreased productivity due to downtime for system cleaning and replacement. Biofilms also cause fouling of the water that passes through the system and results in high levels of suspended, free-swimming (planktonic) bacteria. Planktonic bacterial cells alight on a surface, arrange themselves in clusters and attach. The collected cells begin producing a gooey matrix. The cells signal one another to multiply and form a microcolony. Chemical gradients arise and promote the coexistence of diverse species and metabolic states. Some cells return to their planktonic form and escape, forming new biofilms.

Conventional methods of killing bacteria (such as antibiotics, and chemical disinfection) are often ineffective with biofilm bacteria. The huge doses of antimicrobials required to rid systems of biofilm bacteria are undesirable environmentally (and perhaps not allowed by environmental regulations) and impractical medically (since what it would take to kill the biofilm bacteria would also potentially harm the patient). Standard chemical disinfectants and antibiotics often fail to eliminate biofilms because they do not penetrate biofilms fully or do not harm bacteria of all species and metabolic states in the films. Furthermore, typical biocides kill the bacteria by damaging the cell wall structure. This often results in the release of more toxic endotoxins.

In particular, biofilms present an ever-growing concern due to their prevalence in dental unit water systems. These systems provide particularly well-suited conditions for biofilm formation. The tubing has a very narrow bore (⅛ to ¹⁄₁₆-inch), providing a high internal surface-area-to-volume ratio. Low water pressure, low flow rates, and frequent periods of stagnation also encourage any bacteria introduced from the public water supply or saliva retraction to accumulate within the tubing. Numerous studies conducted over the past thirty years have identified the presence of waterborne opportunistic pathogens in dental unit water. For these reasons, the American Dental Association (ADA) and Centers for Disease Control and Prevention (CDC) have established guidelines for delivery of dental water with less than 500 colony-forming units (CFU) of heterotrophic bacteria per milliliter of water. In response to the need to abate this problem, many products have been developed, generally falling into one of four categories: independent water systems, chemical treatment methods, point-of-use filters, or sterile water delivery systems. Despite the available the aforementioned products, most of the systems available yield only marginal results.

Current approaches to improve the quality of water, and particularly, dental water include waterline flushing, independent reservoirs filled with distilled water, chemical "shock treatment", continuous chemical treatment, mechanical filtration and automated in-line treatment devices. Waterline flushing may temporarily reduce bacteria levels however the biofilm remains completely active and at any given time a person may be exposed to elevated levels of bacteria. Independent water reservoirs filled with distilled water may begin free of bacteria, however without a residual disinfectant the water is readily contaminated from the biofilm within the reservoir and/or tubing. Mechanical filtration may be temporarily effective at filtering bacteria, however, problems with breakthrough, time and costs of replacement are prohibitive. In dentistry, "shock treatments" utilizing solutions with bleach, peroxide, or chlorhexidine have been administered, but the "shock treatments" must be repeated weekly and often daily because the biofilm actually begins to regrow in that short period of time. This type of system also requires use of only sterile water to slow down the biofilm formation. Mature biofilms are notoriously resistant to chemical disinfection including these "shock treatments". Thus, if a practitioner does not treat his system for several weeks, the biofilm will become resistant to this method.

U.S. Pat. No. 5,158,454 incorporates an automated in-line ozone generator that is effective at continuous disinfection. The disadvantage of this device and similar others are that they are bulky and take up limited space from the operatory unit and are expensive to install and operate.

Another system utilized in controlling the presence of infectious microbes in water supplied to dental units is disclosed in U.S. Pat. No. 5,230,624. Here, an in-line filter is provided in a supply line leading to a dental instrument, such as a drill or the like, and contains a polyiodide purification resin. The resin functions to neutralize and kill bacteria by the release of iodine from the resin surface to the bacteria through a demand release process involving electrostatic attraction. The resin is positively charged such that the negatively charged microorganisms are attracted to the resin to the point where iodine is released directly into the microorganism. The disadvantage of the system is that the filters must be changed and the bacteria many times is not effectively controlled.

U.S. Pat. No. 6,106,771 describes a portable system and method for softening and disinfecting dental waterlines. Although period chemical treatment of water lines has been shown to provide temporary improvements in water quality, this approach has failed to provide continuous supply of bacteria free water.

Another system to control the presence of infectious microbes in water supplied to dental units is disclosed in U.S. Pat. No. 5,709,546. This invention provides a process by which mature biofilms, including biofilms of the type produced by gram negative bacteria such as *pseudomonas aeruginosa*, are reduced to the point of elimination through the use of a hydroxycarboxylic acid in relatively low concentrations so as not to be harmful to human tissue. Although the use hydroxycarboxylic acid in relatively low concentrations has been shown to provide temporary improvements in water quality, this approach has also failed to provide continuous supply of bacteria free water.

In light of the failure of the aforementioned techniques to control biofilm, a number of inventions have focused on developing antibacterial polymeric structures. U.S. Pat. Nos. 6,238,575 and 6,261,271 describe an enclosed fluid system structure conjugated with an organic antimicrobial agent as resistant to the formation of biofilm. Although test data indicates a zone of inhibition of bacteria growth, it does not demonstrate long-term resistance to biofilm formation. Biofilm resistance to organic antimicrobials and antibiotics are well documented. Furthermore, the leaching of toxic antimicrobials and antibiotics into the aqueous environment prohibits the use of the aforementioned inventions in potable water or medical/dental water applications.

Furthermore, silver, copper and zinc metal ion biocides have been developed and utilized as antimicrobial agents on and within many different substrates and surfaces. U.S. Pat. Nos. 4,933,178, 6,126,931, and 5,614,568 incorporate metal ion based biocides. Although these inventions present improvements to prior art, the practical application is inappropriate for sensitive end uses including potable, medical and dental water.

A need exists for a fluid handling system which resists the formation of biofilms. Ideally, the fluid handling system would be manufactured from a material which is capable of resisting the formation of biofilms when exposed to an aqueous environment. As a result, existing system designs and conventional component elements, such as tubing, containers, and receptacles could be utilized. In particular, only minimal changes to these systems would be required to replace non-biofilm resistance materials with biofilm resistant materials. Moreover, it would be beneficial to provide a biofilm resistant fluid handling system which requires minimum maintenance and is economically feasible.

BRIEF SUMMARY OF THE INVENTION

The present invention relates to an antimicrobial polymeric resin structure that when exposed to an aqueous environment will resist the formation of biofilm. Typical structures include small diameter tubing and reservoirs. These polymeric resin structures comprise an inorganic carrier that is a cation scavenger and allows ion exchange across the structure wall exposed to the aqueous environment. The inorganic carrier is conjugated with a biocidal metal ion.

Another aspect of the present invention is a method of extending the biocidal properties of the structure. The biocidal metal ion is continuously or periodically introduced into the aqueous contents of the structure resulting in an equilibrium of biocidal metal ion exchange between the biocidal-polymeric resin structure and the aqueous solution containing the biocidal metal ion. Another embodiment of the regeneration method is through solvent deposition of an inorganic carrier conjugated with a metal ion.

According to one embodiment of the present invention, a biofilm resistant fluid handling system is provided. The system includes at least one structural component adapted to retain or deliver fluid. The at least one structural component formed from a biofilm resistant material comprises polymeric resin and an inorganic carrier conjugated with a biocidal metal ion. When a surface of the at least one structural component is exposed to a continuous or intermittent aqueous solution environment the formation of active biofilm on the surface is prevented and planktonic bacteria in proximity of said surface is killed.

According to another aspect of the present invention, the polymeric resin is selected from the group consisting of at least one of polypropylene, polycarbonate, polyurethane, polyvinyl chloride, nylon, polystyrene, polyethylene, polyethylene terephthalate, fluorinated polyethylene, polyvinyl alcohol, polyvinyl acetate, silicone and polyester.

According to another aspect of the present invention, the biocidal metal ion is selected from the group consisting of at least silver, copper and zinc ions. According to another aspect of the present invention, the inorganic carrier is selected from the group consisting of silver sodium hydrogen zirconium phosphate, zirconium phosphate, calcium phosphate, aluminum phosphate, hydroxyl apatite, zeolite, silica gel, silica gel microspheres containing silver thiosulfate complex, silver-substituted glass, and a zinc oxide/silver antimicrobial powder available from AirQual Corporation under the trademark ACT (formerly AMP T558 and MICROFREE).

According to still another aspect of the present invention, the at least one structural component may comprise tubing, at least one of receptacle, reservoir, and container. Moreover, according to another aspect of the present invention, the inorganic carrier is a cation scavenger which is insoluble in water and allows ionic exchange across said surface exposed to the aqueous environment. Additionally, according to another aspect of the present invention, the biofilm resistant fluid handling system prevents the formation of endotoxins.

According to another embodiment of the present invention, a method for manufacturing a biofilm resistant fluid handling system comprising at least one structural component adapted to retain or deliver fluid, the at least one structural component formed from a biofilm resistant material comprising polymeric resin and an inorganic carrier conjugated with a biocidal metal ion, wherein when a surface of the at least one structural component is exposed to a continuous or intermittent aqueous solution environment, the formation of active biofilm on the surface is prevented and planktonic bacteria in proximity of the surface is killed. The method includes blending the inorganic carrier conjugated with a biocidal metal ion in with the polymeric resin to form a biocidal inorganic carrier polymeric resin blend.

According to another aspect of the present invention, the method may further include blending a powder form of the inorganic carrier conjugated with a biocidal metal ion with the polymeric resin. According to another aspect of the present invention, the method may include blending the inorganic carrier conjugated with a biocidal metal ion with the polymeric resin at a concentration of between about 1% to about 50%, and preferably between about 10% to about 30%.

According to another aspect of the present invention, the method may include pelletizing the biocidal inorganic carrier polymeric resin blend to form biocidal inorganic carrier polymeric resin pellets. According to another aspect of the present invention, the biocidal inorganic carrier polymeric resin pellets are formed to have a similar size and mass of a raw polymeric resin. According to another aspect of the present invention, the method includes homogeneously mixing the biocidal inorganic carrier polymeric resin pellets with raw polymeric resin pellets at a ratio ranging from about 1:100 to about 50:100 to produce a biocidal polymeric resin master batch, and preferably at a ratio ranging from about 5:100 to about 20:100.

According to another aspect of the present invention, the method includes forming the biofilm resistant fluid handling system by at least one of a plastic extrusion or molding process. According to another aspect of the present invention, the method includes supplying the at least one of a plastic extrusion or molding process with the biocidal polymeric resin master batch to form the biofilm resistant fluid handling system.

According to another aspect of the present invention, the method includes comprising blending the inorganic carrier conjugated with a biocidal metal ion with the polymeric resin at a concentration of between about 0.05% to about 10%, and preferably between about 0.1% to about 2%. According to another aspect of the present invention, the method includes pelletizing the biocidal inorganic carrier polymeric resin blend to form a biocidal inorganic carrier polymeric resin compound. According to another aspect of the present invention, the method includes grinding the biocidal inorganic carrier polymeric resin compound into a powder ranging from about 5 to 40 mesh to produce a biocidal polymeric resin compounded powder, and preferably between the range about 15 to 25 mesh. According to another aspect of the present invention, the method includes forming the biofilm resistant fluid handling system by a thermal plastic roto-molding process. According to another aspect of the present invention, the method includes supplying the thermal plastic roto-molding process with the biocidal polymeric resin compounded powder to form the biofilm resistant fluid handling system.

According to another embodiment of the present invention, another method is provided for extending the biocidal properties of a biofilm resistant fluid handling system comprising at least one structural component adapted to retain or deliver fluid, the at least one structural component formed from a biofilm resistant material comprising polymeric resin and an inorganic carrier conjugated with a biocidal metal ion, wherein when a surface of the at least one structural component is exposed to a continuous or intermittent aqueous solution environment, the formation of active biofilm on the surface is prevented and planktonic bacteria in proximity of the surface is killed. The method includes one of continuously or periodically introducing a biocidal metal ion, selected from the group consisting of at least silver, copper and zinc ions, into contents of the aqueous solution environment resulting in equilibrium of biocidal metal ion exchange between the biofilm resistant material of the handling system and the aqueous solution environment.

According to another embodiment of the present invention, still another method is provided for extending the biocidal properties of a biofilm resistant fluid handling system comprising affixing a solvent, comprising an inorganic carrier conjugated with a biocidal metal ion, to the surface of the fluid handling system, wherein the surface is smoothed and the inorganic carrier conjugated with a biocidal metal ion is deposited into crevices on the surface thus preventing biofilm growth in the crevices which are desirable for bacteria colonization.

Other exemplary embodiments and advantages of the present invention may be ascertained by reviewing the present disclosure and the accompanying drawings

BRIEF DESCRIPTION OF THE DRAWINGS

The present invention is further described in the detailed description that follows, by reference to the noted drawings by way of non-limiting examples of preferred embodiments of the present invention, in which like reference numerals represent similar parts throughout several views of the drawings, and in which:

FIGS. 1A-B are cross-sectional views of an exemplary embodiment of the present invention having a polymeric structure wall which includes an inorganic carrier conjugated with biocidal metal ion(s), according to an aspect of the present invention; and FIGS. 2A-B are cross-sectional views of a second exemplary embodiment of the present invention which includes a biocidal metal ion solvent deposition, according to an aspect of the present invention.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

The Use of Ionized Silver as an Antimicrobial

The present invention proceeds in a manner contrary to the aforementioned prior art relating to shock chemical treatment, mechanical filtration, or contact killing antimicrobial materials. The present invention enables the use of antimicrobial compounds, such as ionized silver, in low concentrations that are consistent with water to be used in dental, medical, drinking water, or other applications. The silver based compounds are at a low concentration that is not likely to cause damage to soft tissue or otherwise be harmful to a patient. Water continuously treated with silver ions and/or silver compounds is non-toxic or irritating, non-corrosive, does not affect enamel or dentin bonding agents, and does not have in excess of 500 CFU/ml of heterotrophic bacteria. The present invention kills not only the water-born bacteria, but also more importantly, the biofilm bacteria. By eliminating the formation of mature biofilm through a constant supply of an effective potable biocide, this major source of contamination is eliminated. The biocidal metal ion used for conjugation with an inorganic carrier includes silver, copper, and zinc ions, while the preferred biocidal metal ion is silver ion. The silver ion is an example of a metal ion known to possess biocidal activity. The use of silver salts, including both inorganic and organic ligands, as biocidal agents has long been known in the prior art.

The mechanism by which silver inactivates bacteria and some viruses is now herein discussed. Primarily, silver reacts with the bacterium's cell wall. The cell wall of bacteria is a structure of proteins connected by amino acids to provide it with mechanical strength and stability. The structural proteins are called peptidoglycans. Silver reacts with the exposed peptidoglycans, blocking their ability to transfer oxygen (energy) into the cell thus inactivating the bacteria, which results in expiration. Since mammalian cells have an entirely different coating on their cells (no peptidoglycans), silver has no effect upon those cells. This action of silver is not disease specific, like the synthetic antibiotics, but cell-structure specific. Any cell that does not possess a chemically resistant wall is available to action by silver. This would include all bacteria and other organisms without cell walls, for example, the extracellular viruses.

While many organic antibiotics and antimicrobial compounds have been effective at killing specific microorganisms, silver ions have been demonstrated to have a broad range of biocidal efficacy, and yet, very few resistant strains of microorganisms exist. Prior art based on organic antibiotics and antimicrobial compounds effectively destroy the cell wall but allow endotoxins from gram-negative bacteria to be released. Eventually the bacteria itself becomes resistant to this art of disinfection.

First Study Demonstrating the Biocidal Efficacy of Silver

A demonstration of the biocidal efficacy of silver ions disinfecting small diameter dental operatory tubing with developed strains of heterotrophic bacteria resistant to chlorhexidine is herein discussed below. For the demonstration, STERISIL PURE TUBE BR90 was the material under test. A dilution factor of X10 was utilized. It is noted that the study was conducted without SHOCKTUBE SKB biofilm pretreatment. Moreover, the source water bottles were not cleaned for the duration of the study. Data from the study is shown in Table 1 below.

TABLE 1

| | sample date<br>report date | Jan. 24, 2002<br>Jan. 31, 2002<br>baseline | Jan. 28, 2002<br>Feb. 4, 2002<br>Day-4 | Jan. 31, 2002<br>Feb. 7, 2002<br>week-1 | Feb. 21, 2002<br>Mar. 1, 2002<br>w-4 | Mar. 21, 2002<br>Mar. 28, 2002<br>w-8 | Apr. 18, 2002<br>Apr. 25, 2002<br>w-12 | 5/1<br>Source<br>Water |
|---|---|---|---|---|---|---|---|---|
| | | | | | CFU/ml | | | |
| Chair 138 a/w syringe | distilled water | 25,500 | 0 | 0 | 80 | 80 | 230 | 59,400 |
| Chair 138 handpiece | distilled water | 45,000 | 0 | 20 | 10 | 20 | 130 | 59,400 |
| Chair 138 cavitron | distilled water | 21,600 | 10 | 10 | 30 | — | 250 | 59,400 |
| Chair 140 cavitron | distilled water | 1,060 | 10 | 40 | 20 | 40 | 250 | 3,600 |
| Chair 142 a/w syringe | distilled water | 15,900 | 30 | 10 | 50 | 30 | 60 | 141,600 |
| Chair 142 handpiece | distilled water | 27,000 | 10 | 20 | 50 | 50 | 80 | 141,600 |
| Chair 142 cavitron | distilled water | 22,200 | 40 | 10 | 20 | 80 | 90 | 141,600 |
| AVG. HPC (CFU/ml): | | 22,609 | 14 | 16 | 37 | 43 | 156 | 86,657 |

The average HPC contaminate level of planktonic bacteria released from established biofilm in the tubing structure was 22,609 CFU/ml. After treatment with silver ions the HPC contamination remained below the 500 CFU/ml drinking and dental water standard established by the Center for Disease Control (CDC) for the entire test period. Furthermore, the distilled source water averaged 85,657 CFU/ml HPC as contamination from biofilm on the reservoir bottle surface. This source of contamination is exactly the problem that is abated by the present invention. Preventing the formation of biofilm on the structure surfaces exposed to an aqueous environment eliminates the continuous population of planktonic bacteria. An effective polymeric biocidal structure should be capable of killing heterotrophic bacteria that includes both gram-positive and gram-negative bacteria while at the same time does not cause the release of endotoxins. The aforementioned study demonstrates the efficacy of silver ions to achieve these requirements. As a result, the above data confirms the unique efficacy silver ions exhibit for broad range disinfection of otherwise resistant bacteria strains.

Second Study Demonstrating the Biocidal Efficacy of Silver Ions

A second study was conducted to demonstrate the biocidal efficacy of silver ions released from a polymeric structure at very low concentrations. Four operatory units with existing reservoir systems were provided with the prepared ionized silver solution for a period of six weeks. In this study, the concentration of ionized silver was reduced to a range of 0.02 to 0.05 ppm to evaluate the biocidal efficacy at low concentrations that simulate ionized silver leaching from the structure. The operatory units were initially shock treated with an organic acid and subsequent peroxide/silver solution to reduce the baseline heterotrophic bacteria levels. Throughout the entire six-week study, heterotrophic bacteria levels for all four operatory units remained below 3 CFU/ml. The results of the second study are shown in Table 2 below.

TABLE 2

| Operatory Unit | Heterotrophic CFU/ml | | | | | | |
|---|---|---|---|---|---|---|---|
| | Baseline | Week 1<br>1/26 | Week 2<br>2/2 | Week 3<br>2/9 | Week 4<br>2/16 | Week 5<br>2/23 | Week 6<br>3/5 |
| 1 | 1,200 | 0 | 20(1) | 3 | 0 | 1 | 0 |
| 2 | 4,740 | 0 | 0 | 0 | 0 | 0 | 0 |
| 3 | 40 | 0 | 0 | 0 | 1 | 1 | 0 |
| 4 | 3,620 | 0 | 0 | 0 | 2 | 0 | 0 |

Description of Exemplary Structural Embodiments of the Present Invention

The structural embodiments of the present invention may be any fluid retaining device, tubular structure, reservoirs, tanks, fluid passages, containers, caps, lids, or any other structural component which may be formed from the materials described within this specification to comprise a portion of a biofilm resistant fluid handling system.

Other Aspects of the Present Invention

In the dental industry a major concern with the administration of continuous biocidal treatment is the potential negative effect on enamel or dentin bonding agents from the biocide. An additional clinical study was performed to substantiate the effect of silver ions on enamel or dentin bonding agents. The study concluded that the treatment of human enamel surface with silver ions does not adversely affect the bond strength.

One main disadvantage of silver ion-based biocides is that silver ion causes discoloration (yellowing/browning) when present in products that are exposed to the environment. The silver ion is easily oxidized when exposed to air and light at room and elevated temperatures and forms a discolored precipitate in the presence of anionic surfactants such as sodium lauryl sulfate (SLS) that substantially diminishes the acceptability of the product to consumers. It is therefore necessary to conjugate the silver ion with a cation scavenger that will minimize the formation of silver oxide compounds.

The inorganic carrier to be used for conjugating with a biocidal metal ion of the invention includes, for example, zirconium phosphate, aluminum phosphate, zeolite, and silica gel. The preferred inorganic carrier of the invention is zirconium phosphate or zeolite. The most preferred inorganic carrier is zirconium phosphate.

The inorganic carrier conjugated with an antimicrobial metal ion is commercially available in various forms. The specific preferred ion exchange material is an antimicrobial silver sodium hydrogen zirconium phosphate available from Toagosei Co., Ltd. under the trade mark NOVARON. Other potentially preferred silver-containing solid inorganic antimicrobials that are useful in this invention are SILVACE A-903K (trade mark of calcium phosphate manufactured by Taihei Chemical Industrial Co., Ltd.), RASAP AN-600SA (trade mark of aluminum phosphate manufactured by Rasa Industries, Ltd.), APACIDER AK (trade mark of hydroxyapatite manufactured by Sangi Co., Ltd.), ZEOMIC AW10D (trade mark of zeolite manufactured by Shinanen Co., Ltd.), AMENITOP (trade mark of silica gel microspheres containing silver thiosulfate complex manufactured by Matsushita Electric Industrial Co., Ltd.), a silver substitute glass available from Ishizuka Glass under the trade mark IONPURE, and a zinc oxide/silver antimicrobial powder available from AirQual Corporation under the trademark ACT (formerly AMP T558 and MICROFREE, both available from DuPont).

The inorganic carrier conjugated with an antimicrobial metal ion is blended with the polymeric resin of choice. The polymeric resin is selected based on the method of production (for example blow molding, injection molding, extrusion, sheet extrusion or thermoforming) and product specifications. Examples of typical polymeric materials, but not intended to be limited to, are polyurethane, polyvinylchloride, nylon, polystyrene, polyethylene, polyvinyl alcohol, polyvinyl acetate, silicone or polyester. Specific to the dental industry, the preferred polymeric resin for a blow molded reservoir structure is a high density polyethylene copolymer, specifically FORTIFLEX B50 manufactured by BP Solvay. Small diameter tubing is typically extruded from polyurethane or polyvinylchloride resins, specifically PELLETHAN 2103-90 AEL by Dow Plastics and COLORITE 6811.

The inorganic carrier conjugated with an antimicrobial metal ion may be blended with the resin by conventional methods such as by mixing or extrusion at a concentration of about 1% to 50%, and preferably between about 10% to about 30%. The resins may be added as a premix or directly to the resin composition. Moreover, a master batch technique may be employed. For example, a concentrated mixture of the inorganic carrier conjugated with an antimicrobial metal ion and the polymeric resin may be extruded into pellet forms, similar in size and mass of the raw polymeric resin pellet. The master batch is then homogeneously mixed with the raw polymeric resin pellets at a ratio ranging from about 1:100 to about 50:100, and preferably a range of about 5:100 to about 20:100. The inorganic carrier conjugated with an antimicrobial metal ion of the present invention has good thermostability so it can be used in the typical processing temperatures of the chosen polymeric resin.

First Exemplary Method to Prolong the Biocidal Metal Ion Conjugation

Prior art for biocidal polymeric resins has a limited effective biocidal time span. The biocidal active ingredient will eventually be leached out of the polymeric structure surface rendering the product no longer useful. The present invention includes a couple of exemplary methods to prolong the biocidal metal ion conjugation within the ion exchange carrier-polymeric resin structure.

One preferred method of biocide replenishment is continuously or periodically introducing a metal ion solution into the aqueous contents of the structure resulting in an equilibrium of biocidal metal ion exchange between the biocidal-polymeric resin structure and the aqueous solution containing the biocidal metal ion. Methods of generating the metal ion biocide solution are disclosed in PCT International Application No. PCT/US02/10960 filed on Apr. 9, 2002, entitled "Structure and Process for Continuously Treating Dental Unit Water", which is based upon U.S. Provisional 60/282,376, filed Apr. 9, 2001, entitled "Structure and Process for Continuously Treating Dental Unit Water", the contents of which are incorporated herein by reference. The concentration of the biocidal metal ion solution should be greater than the exhausting rate of the biocidal metal ion from the polymeric structure surface. Preferably the concentration is greater than about 1 ppm, and most preferably from about 1 ppm to about 10 ppm. Pure metal ion concentrations exceeding approximately 10 ppm while not in a conjugated form will cause discoloration to the polymeric structure.

FIGS. 1A-B show cross-sectional views of an exemplary embodiment of the present invention having a polymeric structure wall with a pair of sides 10 with an inorganic carrier conjugated with biocidal metal ion(s) 12 mixed within the polymeric material forming the wall, according to an aspect of the present invention. The structure defines an internal passageway of which biocidal metal ion solution 20 is flowed through according to the aforementioned replenishing process.

Third Study Demonstrating Biocide Replenishment

To demonstrate the aforementioned method, a flow-through silver ion generator (Robey, Pomona) was used to prepare 10 gallons of distilled water with an ionized silver concentration of about 2.8 ppm to about 4 ppm. Ten operatory units were treated with the prepared ionized silver solution for a period of two weeks. Initial concentrations of heterotrophic bacteria ranged from about 120 to about 12,580 CFU/ml. In all ten operatory units, bacteria levels were reduced to zero in no more than two weeks. The results of the following study are presented below in Table 3.

TABLE 3

| | Heterotrophic CFU/ml | | | |
|---|---|---|---|---|
| Unit No. | Baseline | Week 1 (Ag+ Trmt.) | Week 2 (Ag+ Trmt.) | Week 3 & 4 (No Ag+ Trmt.) |
| 1 | 180 | 0 | 0 | 0 |
| 2 | 2,020 | 0 | 0 | 0 |
| 3 | 12,580 | 0 | 0 | 0 |
| 4 | 10,000 | 20 | 40 | 0 |
| 5 | 160 | 20 | 20 | 0 |
| 6 | 7,760 | 0 | 0 | 0 |
| 7 | 160 | 0 | 0 | 0 |
| 8 | 10,000 | 40 | 0 | 0 |
| 9 | 120 | 0 | 0 | 0 |
| 10 | 10,000 | 0 | 0 | 0 |

Of particular interest is the post treatment data for weeks 3 and 4. The residual ionized silver statically attached to the dental tubing interior wall prevented the repopulation of bacteria for the following two weeks of testing. Furthermore, municipal source water containing planktonic bacteria was also completely disinfected from the residual ionized silver.

Second Exemplary Method to Prolong the Biocidal Metal Ion Conjugation

Another preferred method of biocide replenishment is by solvent deposition. The inorganic carrier conjugated with an antimicrobial metal ion may be blended with an organic solvent common to both the polymeric resin and the carrier at a concentration of about 1% to about 74%, and preferably between about 25% to about 50%. The substrate (structure surface exposed to the aqueous environment) is soaked with the concentrated solution for a period of time sufficient to dissolve the substrate surface but limiting the contact time to minimize potential structural degradation. The concentrated solution is evacuated and the solvent then volatilized with heated air; subsequently curing the deposed metal ion solution to the substrate. The structure surface is then rinsed with sterile deionized water. This process also has the benefit of smoothing the polymeric structure surface and depositing the biocidal carrier into crevices that are desirable for bacteria colonization.

FIGS. 2A-B are cross-sectional views of an exemplary embodiment of the present invention which includes a biocidal metal ion solvent deposition, according to an aspect of the present invention. The exemplary embodiment of the present invention has a polymeric structure wall with a pair of sides 10 with an inorganic carrier conjugated with biocidal metal ion(s) 12 mixed within the polymeric material forming the wall, according to an aspect of the present invention. The structure defines an internal passageway having a surface of which biocidal metal ion solvent deposition 22 is applied thereto.

Fourth Study Comparing Tubing with Silver Ion Continuous Treatment Devices

A clinical study was conducted to compare biofilm formation, microbial and endotoxin levels in dental unit waterlines (DUWLs) with three types of tubing equipped with three silver ion continuous treatment devices. DUWLs with antimicrobial tubing (AT) (STERISIL, Castle Rock, Colo.), new regular tubing (NT) (A-DEC, Newburg, Oreg.) and/or existing regular tubing (ET) that were equipped with PURETUBE, PURETUBE PLUS or PURELINE50 (STERISIL) were investigated. Tubing without treatment served as the control. Microbial CFU/mL was determined using membrane filter technique. The filters were incubated on R2A agar at 22oC for 7 days. Endotoxins (EU/mL) were analyzed using a chromogenic Limulus method. Biofilm was examined using scanning electron micrograph (SEM). The viability of attached biofilm was tested via standard methods. In the control group, NT lumen was completely covered by biofilm after one month. The CFU/mL were 107,134±101,876 and the EU/mL were 35.5±73.0. In experimental groups, AT combined with treatment devices effectively reduced the biofilm formation. At 7-month, both AT samples showed little or no biofilm. The biofilm in the ET remained similar to its control, although no viable cells were enumerated from all tubing samples. Following initial treatment, higher endotoxins were detected in the PURETUBE PLUS and PURELINE50 (319% and 245% of the baseline, respectively), with the highest at 1053 EU/mL. However, this was not observed in the PURETUBE. PURETUBE maintained the endotoxins below the U.S. Pharmacopeia's standard ( 0.25 EU/mL) after two weeks, unless the source water was contaminated. This study concluded AT combined with the continuous silver ion regeneration effectively reduce biofilm formation.

In the above study, two dental units equipped with antimicrobial air/water syringe tubing and antimicrobial bottles that were constructed by the inventive techniques as disclosed above were used under normal practices for seven months and demonstrated 0 cfu/cm2 of viable biofilm formation and nil production of endotoxins.

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

What is claimed is:

1. A biofilm resistant fluid handling system comprising:
at least one structural component adapted to retain or deliver fluid, said at least one structural component formed from a biofilm resistant material comprising polymeric resin and a inorganic carrier conjugated with a biocidal metal ion, wherein when a surface of said at least one structural component is exposed to a continuous or intermittent aqueous solution environment the formation of active biofilm on said surface is prevented and planktonic bacteria in proximity of said surface is killed; and
an aqueous solution retained or delivered by said at least one structural component, said aqueous solution comprising the biocidal metal ion in an amount sufficient to replenish the biocidal metal ion that is exhausted from the biofilm resistant material.

2. The biofilm resistant fluid handling system according to claim 1, wherein said polymeric resin is selected from the group consisting of polypropylene, polycarbonate, polyurethane, polyvinyl chloride, nylon, polystyrene, polyethylene, polyethylene terephthalate, fluorinated polyethylene, polyvinyl alcohol, polyvinyl acetate, silicone and polyester.

3. The biofilm resistant fluid handling-system according to claim 1, wherein said biocidal metal ion is selected from the group consisting of silver, copper and zinc ions.

4. The biofilm resistant fluid handling-system according to claim 1, wherein said inorganic carrier is selected from the group consisting of silver sodium hydrogen, zirconium phosphate, zirconium phosphate, calcium phosphate, aluminum phosphate, hydroxyl apatite, zeolite, silica gel, silica gel micro spheres containing silver thiosulfate complex, silver-substituted glass, and zinc oxide/silver antimicrobial powder.

5. The biofilm resistant fluid handling system according to claim 1, wherein said at least one structural component comprises tubing.

6. The biofilm resistant fluid handling-system according to claim 1, wherein said at least one structural component comprises a receptacle, reservoir, or container.

7. The biofilm resistant fluid handling system according to claim 1, wherein said inorganic carrier is a cation scavenger which is insoluble in water and allows ionic exchange across said surface of the structural component exposed to the aqueous-solution.

8. The biofilm resistant fluid handling system according to claim 1, wherein the biofilm resistant material is adapted to kill heterotrophic bacteria without causing the release of endotoxins.

9. A method for extending the biocidal properties of a bioresistant fluid handling system comprising at least one structural component adapted to retain or deliver fluid, the at least one structural component formed from a biofilm resistant material and an inorganic carrier conjugated with a biocidal metal ion, wherein when a surface of the at least one structural component is exposed to a continuous or intermittent aqueous solution environment, the formation of active biofilm on the surface is prevented and planktonic bacteria in proximity of the surface is killed, the method comprising:

replenishing the biocidal metal ion that is exhausted from the biofilm resistant material by continuously or periodically introducing the biocidal metal ion, selected from the group consisting of at least silver, copper and zinc ions, into the contents of the aqueous solution environment resulting in equilibrium of biocidal metal ion exchange between the biofilm resistant material of the handling system and the aqueous solution environment.

10. A method for imparting extended biocidal properties to a dental water handling system comprising the steps of:

providing at least one structural component adapted to retain or deliver dental water, wherein the at least one structural component is formed from a biofilm resistant material comprising a polymeric resin and an inorganic carrier conjugated with at least one biocidal metal ion that acts to prevent the formation of active bio film on the surface of the structural component and to kill planktonic bacteria in proximity of the surface when in contact with the dental water; and contacting the biofilm resistant material with dental water comprising the biocidal metal ion, whereby biocidal metal ion exchange between the biofilm resistant material and the dental water replenishes biocidal metal ion exhausted from the biofilm resistant material.

11. The method according to claim 10 wherein the structural component is formed by blending together the inorganic carrier conjugated with biocidal metal ion and the polymeric resin to provide a biocidal inorganic carrier/polymeric resin blend; pelletizing the biocidal inorganic carrier/polymeric resin blend to provide biocidal inorganic carrier/polymeric resin pellets; and using the pellets to form the structural component by a plastic extrusion or molding process.

12. The method according to claim 11 further comprising forming the pellets to have a similar size and mass of raw polymeric resin pellets; homogeneously mixing the biocidal inorganic carrier/polymeric resin pellets with raw polymeric resin pellets to provide a biocidal polymeric resin master batch; and supplying the biocidal polymeric resin master batch to a plastic extrusion or molding process.

13. The method according to claim 12 wherein the biocidal inorganic carrier/polymeric resin is ground into a 5-40 mesh powder and supplied to a thermal plastic roto-molding process.

14. A method for extending the biocidal properties of a biofilm resistant fluid handling system comprising at least one structural component adapted to retain or deliver fluid, the at least one structural component formed from a biofilm resistant material comprising polymeric resin and an inorganic carrier conjugated with a biocidal metal ion, wherein when a surface of the at least one structural component is exposed to a continuous or intermittent aqueous solution environment, the formation of active biofilm on the surface is prevented and planktonic bacteria in proximity of the surface is killed, the method comprising;

affixing a solvent, comprising an inorganic carrier conjugated with a biocidal metal ion, to the surface of the at least one structural component;

wherein the surface is smoothed and the inorganic carrier conjugated with a biocidal metal ion is deposited into crevices on the surface thus preventing biofilm growth in the crevices which are desirable for bacteria colonization.

15. A method for extending the biocidal properties of a biofilm resistant fluid handling system comprising at least one structural component adapted to retain or deliver fluid, the at least one structural component formed from a biofilm resistant material comprising polymeric resin and an inorganic carrier conjugated with a biocidal metal ion, wherein when a surface of the at least one structural component is exposed to a continuous or intermittent aqueous solution environment, the formation of active biofilm on the surface is prevented and planktonic bacteria in proximity of the surface is killed, the method comprising;

affixing a solvent, comprising an inorganic carrier conjugated with a biocidal metal ion, to the surface of the at least one structural component;

wherein the solvent is affixed to the surface of the at least one structural component by:

blending a quantity of the inorganic carrier conjugated with the biocidal metal ion with an organic solvent common to the inorganic carrier and polymeric resin of the structural component to form a liquid composition comprising 1-74% inorganic carrier conjugated with biocidal metal ion;

soaking the surface with the liquid composition for a period of time sufficient to dissolve the surface without significantly degrading the structural component; and removing the solvent to deposit the inorganic carrier with biocidal metal ion onto the surface of the structural component.

16. The biofilm resistant fluid handling-system according to claim 1, wherein said aqueous solution comprises dental water.

* * * * *